US008941448B2

(12) United States Patent
Yu et al.

(10) Patent No.: US 8,941,448 B2
(45) Date of Patent: Jan. 27, 2015

(54) M-WAY COUPLER

(75) Inventors: Tiku Yu, Yilan (TW); Jing-Hong Conan Zhan, Hsinchu (TW)

(73) Assignee: Mediatek Singapore Pte. Ltd., Singapore (SG)

( * ) Notice: Subject to any disclaimer, the term of this patent is extended or adjusted under 35 U.S.C. 154(b) by 478 days.

(21) Appl. No.: 13/272,802

(22) Filed: Oct. 13, 2011

(65) Prior Publication Data

US 2013/0093533 A1 Apr. 18, 2013

(51) Int. Cl.
*H01P 5/12* (2006.01)
*H01P 5/16* (2006.01)
*H03H 7/18* (2006.01)

(52) U.S. Cl.
CPC ........................................ *H01P 5/16* (2013.01)
USPC ........................................... 333/100; 333/126

(58) Field of Classification Search
CPC .................................... H01P 5/12; H03H 7/18
USPC .................................. 333/100, 124, 126, 128
See application file for complete search history.

(56) References Cited

U.S. PATENT DOCUMENTS

| | | | | | |
|---|---|---|---|---|---|
| 4,117,494 | A | * | 9/1978 | Frazita | 343/844 |
| 5,021,755 | A | * | 6/1991 | Gustafson | 333/128 |
| 5,045,821 | A | * | 9/1991 | Staudinger et al. | 333/118 |
| 5,872,491 | A | * | 2/1999 | Kim et al. | 333/101 |

FOREIGN PATENT DOCUMENTS

| | | |
|---|---|---|
| CN | 1065761 | 10/1992 |

OTHER PUBLICATIONS

Kim, J.G., et al.; "Miniature Four-Way and Two-Way 24 GHz Wilkinson Power Dividers in 0.13 um CMOS;" IEEE Microwave and Wireless Components Letters; vol. 17; No. 9; Sep. 2007; pp. 658-660.
Tabesh, M., et al.; "A 65nm CMOS 4-Element Sub-34mW/Element 60GHz Phased-Array Transceiver;" 2011 IEEE International Solid-State Circuits Conference; pp. 166-169.
Full English (machine) translation of CN1065761 (Published Oct. 28, 1992).

* cited by examiner

*Primary Examiner* — Dean Takaoka
(74) *Attorney, Agent, or Firm* — McClure, Qualey & Rodack, LLP

(57) ABSTRACT

An M-way coupler having a first port, M second ports, M transmission line sections, M isolation resistors and a phase shifting network is disclosed, where M is an integer number greater than 1. The M transmission line sections couple the first port to the M second ports, respectively. Each of the M isolation resistors has a first terminal and a second terminal. The first terminals of the M isolation resistors are coupled to the M second ports, respectively. The phase shifting network has M I/O terminals coupled to the second terminals of the M isolation resistors, respectively. The phase shifting network is arranged to provide a phase shift within a predetermined tolerance margin between arbitrary two I/O terminals of the M I/O terminals of the phase shifting network.

18 Claims, 7 Drawing Sheets

M-WAY COUPLER

BACKGROUND OF THE INVENTION

1. Field of the Invention

The present invention relates to power dividers and power combiners in telecommunications, and in particular relates to an M-way coupler having one input port and M output ports or having M input ports and one output port.

2. Description of the Related Art

In a phased array, the relative phases of the respective signals feeding the antennas are varied in such a way that the effective radiation pattern of the array is reinforced in a desired direction and suppressed in undesired directions. The elements of a phased array are connected by power dividers and power combiners. Power dividers and power combiners are used in the field of radio technology to couple a defined amount of electromagnetic power in a transmission line to another port where it can be used in another circuit. Hereinafter, "M-way coupler" is a general term for the power dividers and power combiners, where M represents an integer, and an M-way coupler may have one input port and M output ports (as a power divider) or have M input ports and one output port (as a power combiner). An essential feature of the M-way couplers is that they only couple power flowing in one direction. Power entering the output port is not coupled. To reduce the amount of M-way couplers required to build a phased array, the current trend is to increase the number M.

However, a large M may result in non-identical circuits in the coupling paths of the M-way coupler and may increase the complexity of connecting the M-way coupler to other function blocks. An M-way coupler with a symmetric layout (e.g. having identical circuit design for all coupling paths) and having the M input/output ports widely spaced apart from each other, thereby simplifying the routing lines between the M-way coupler and other function blocks, is called for.

BRIEF SUMMARY OF THE INVENTION

A detailed description is given in the following embodiments with reference to the accompanying drawings.

An M-way coupler according to an exemplary embodiment of the invention comprises a first port, M second ports, M transmission line sections, M isolation resistors and a phase shifting network. M is an integer number greater than 1. When implementing a power divider, the first port is used as an input port and the M second ports are used as output ports. On the contrary, when implementing a power combiner, the M second ports are used as input ports and the first port is used as an output port. The M transmission line sections couple the first port to the M second ports, respectively. Each of the M isolation resistors has a first terminal and a second terminal. The first terminals of the M isolation resistors are coupled to the M second ports, respectively. The phase shifting network has M I/O terminals coupled to the second terminals of the M isolation resistors, respectively. The phase shifting network is arranged to provide a phase shift within a predetermined tolerance margin between arbitrary two I/O terminals of the M I/O terminals of the phase shifting network.

In an exemplary embodiment, the phase shifting network comprises a plurality of phase shifters each coupled between two I/O terminals of the M I/O terminals of the phase-shifting network. At least one of the phase shifters is an LC network or a combination of a transmission line and a capacitor wherein the transmission line and the capacitor are connected in series.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
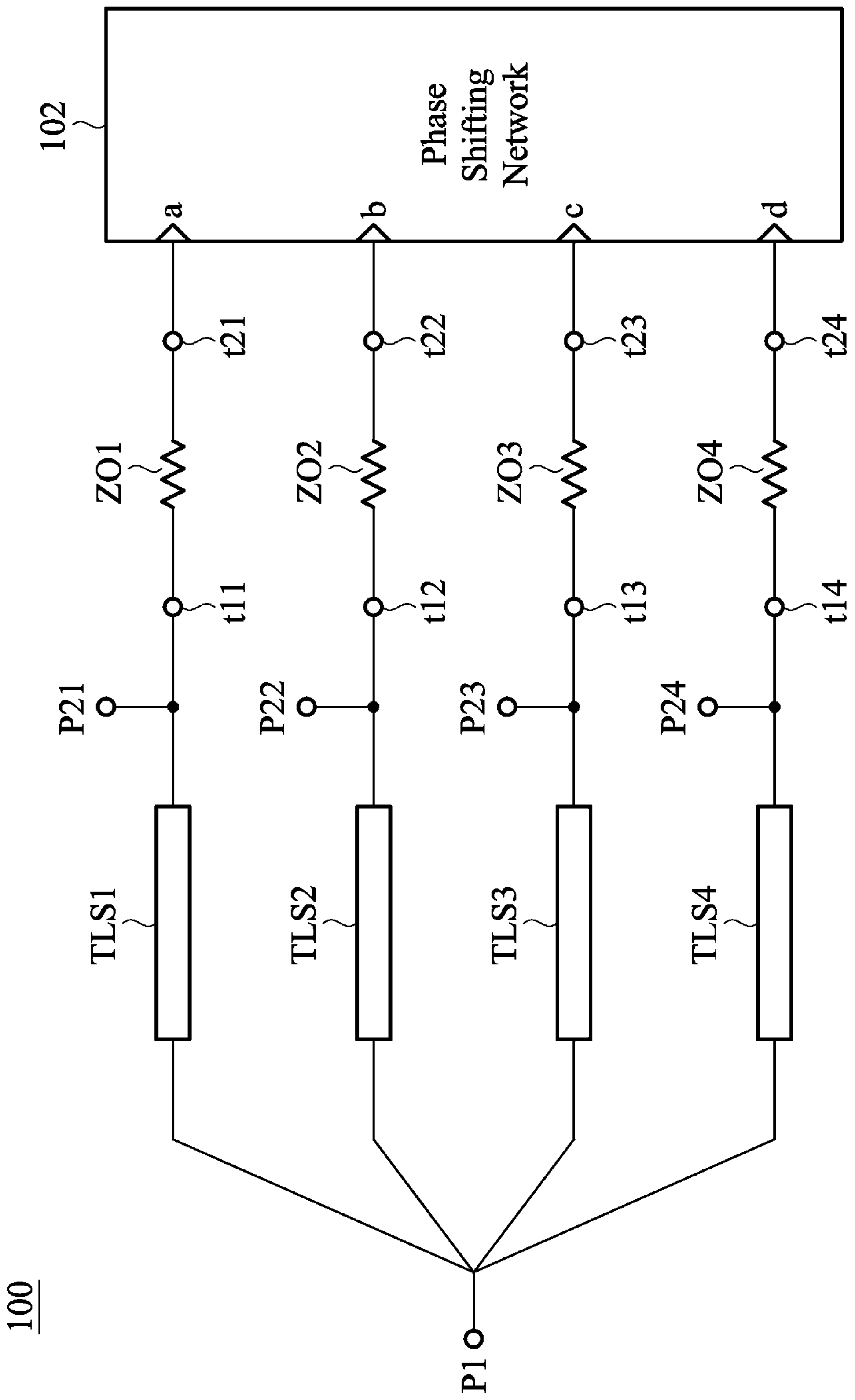
FIG. 1 illustrates a four-way coupler 100 which is an exemplary embodiment of the disclosed M-way coupler, where M is an integer greater than 1 and is set to four.

FIG. 1 illustrates a four-way coupler 100 which is an exemplary embodiment of the disclosed M-way coupler, where M can be an integer greater than 1 and is set to four in this embodiment. The four-way coupler 100 comprises a first port P1, four second ports P21 to P24, four transmission line sections TLS1 to TLS4, four isolation resistors Z01 to Z04 and a phase shifting network 102. When implementing a power divider, the first port P1 is used as an input port and the four second ports P21 to P24 are used as output ports. When used in reverse (to implement a power combiner), the four second ports P21 to P24 are used as input ports and the first port P1 is used as an output port. Note that it is not intended to limit the disclosed circuit to be a power divider or a power combiner or to limit the number M to 4. The components of the 4-way coupler 100 are detailed below.

As shown in FIG. 1, by the four transmission line sections TLS1 . . . TLS4, the first port P1 is coupled to the four second ports P21 . . . P24, respectively. The four isolation resistors Z01 to Z04 each have a first terminal (named "t11" to "t14") and a second terminal (named "t21" to "t24"). The first terminals t11 . . . t14 of the four isolation resistors Z01 . . . Z04 are coupled to the four second ports P21 . . . P24, respectively. The phase shifting network 102 has four I/O terminals named "a" to "d". The four I/O terminals a . . . d are coupled to the second terminals t21 . . . t24 of the four isolation resistors Z01 . . . Z04, respectively.

In an exemplary embodiment, the transmission line sections TLS1 . . . TLS4 each are implemented by a transmission line. A transmission line is operative to carry alternating current of a radio frequency, that is, currents with a frequency high enough that its wave nature must be taken into account. Types of transmission lines include coaxial cable, microstrips, striplines, balanced lines, twisted pairs, etc. In another embodiment, the disclosed transmission line section may be implemented by lumped elements. Types of lumped elements include inductors, capacitors, resistors and other passive circuits. The transmission line sections TLS1 . . . TLS4 may be implemented by identical circuits, for example, four transmission lines of an identical length, or four identical circuits built by lumped elements. Note that it is not intended to limit the transmission line sections TLS1 . . . TLS4 to be identical circuits. In some embodiments, the four transmission line sections TLS1 . . . TLS4 may be slightly different.

As for the isolation resistors Z01 . . . Z04, they may have identical resistance and be operative to isolate the M second ports P21 . . . P24 and match the impedance thereof.

The phase shifting network 102 is arranged to provide a phase shift within a predetermined tolerance margin between arbitrary two I/O terminals (e.g., between "a" and "b", between "a" and "c", between "a" and "d", between "b" and "c", between "b" and "d", and between "c" and "d") of the four I/O terminals a . . . d of the phase shifting network 102. Note that the phase shifting network 102 is not a simple electrical joint connecting the second terminals t21 . . . t24 of the isolation resistors Z01 . . . Z04. Instead, the phase shifting network 102 may comprise a plurality of electronic components, wherein at least one of the electronic components is coupled between two I/O terminals of the four I/O terminals a . . . d of the phase shifting network 102. In an exemplary embodiment, the four I/O terminals a . . . d are physically spaced apart from each other by the plurality of electronic components of the phase shifting network 102. Because the four I/O terminals a . . . d are widely spaced apart from each other, redundant routing lines are not required so that different coupling paths of the four-way coupler 100 may have identical layout designs in their transmission line sections and it may be easy to connect the four second ports P21 . . . P24 to other function blocks. In an exemplary embodiment, circuit layout of the phase shifting network 102 is symmetric. In another exemplary embodiment, a phase shift or even impedance between arbitrary two I/O terminals of the four I/O terminals a . . . d is zero.

In an exemplary embodiment, the phase shifting network 102 comprises a plurality of phase shifters. Each phase shifter is coupled between two I/O terminals of the four I/O terminals a . . . d of the phase shifting network 102. Capacitors, inductors and transmission lines are generally used to build the disclosed phase shifter, wherein the capacitors are used to produce phase leads, and the inductors or the transmission lines are used to produce phase lags. At least one of the disclosed phase shifter is an LC network or a combination of a transmission line and a capacitor wherein the transmission line and the capacitor are connected in series.

Figure 2B:
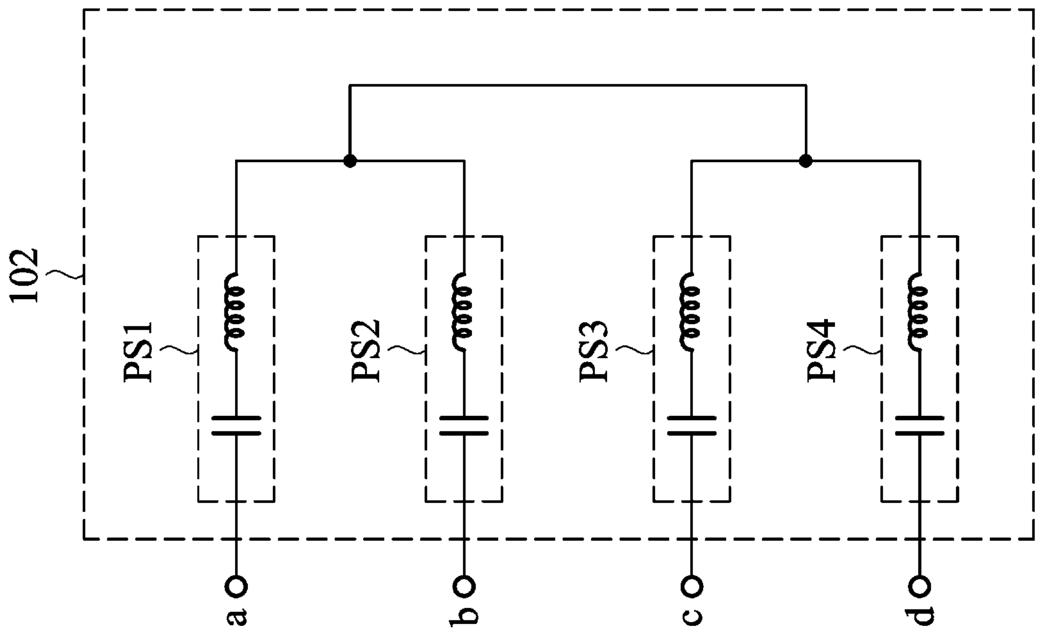
FIG. 2B shows an exemplary circuit design of the phase shifting network 102 of FIG. 2A.
Figure 2A:
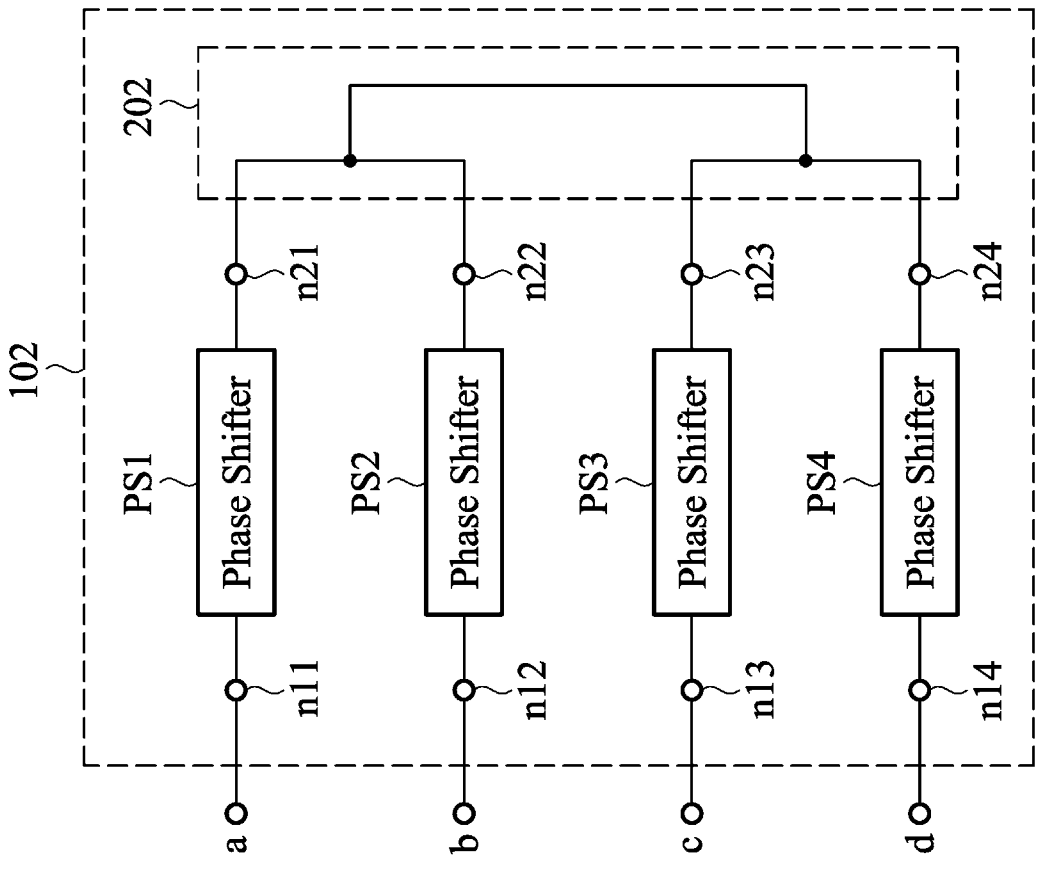
FIG. 2A shows an exemplary embodiment of the phase shifting network 102, which comprises four phase shifters PS1 to PS4.

FIG. 2A shows an exemplary embodiment of the phase shifting network 102, which comprises four phase shifters PS1 to PS4. The four phase shifters PS1 . . . PS4 each have a first terminal (named n11 to n14) and a second terminal (named n21 to n24). The second terminals n21 . . . n24 of the four phase shifters PS1 . . . PS4 are connected together (by connection 202) while the first terminals n11 . . . n14 of the four phase shifters PS1 . . . PS4 are coupled to the four I/O terminals a . . . d of the phase shifting network 102, respectively. Each of the phase shifters PS1 . . . PS4 may provide a phase shift of 0 degree, or, each of the phase shifters PS1 . . . PS4 may provide a phase shift of 180 degrees. In this manner, no phase shift is introduced between arbitrary two I/O terminals of the four I/O terminals a . . . d and the impedance matching and isolation of the four second ports P21 . . . P24 of the four-way coupler 100 of FIG. 1 are not affected. Note that the connection 202 between the second terminals n21 . . . n24 of the four phase shifters PS1 . . . PS4 is implemented by an electronic joint (referring to an exemplary layout shown in FIG. 2C).

FIG. 2B shows an exemplary circuit design of the phase shifting network 102 of FIG. 2A. As shown, each of the phase shifters PS1 . . . PS4 comprises a capacitor and an inductor connected in series. The phase shifters PS1 . . . PS4 have identical circuits.

Figure 2C:
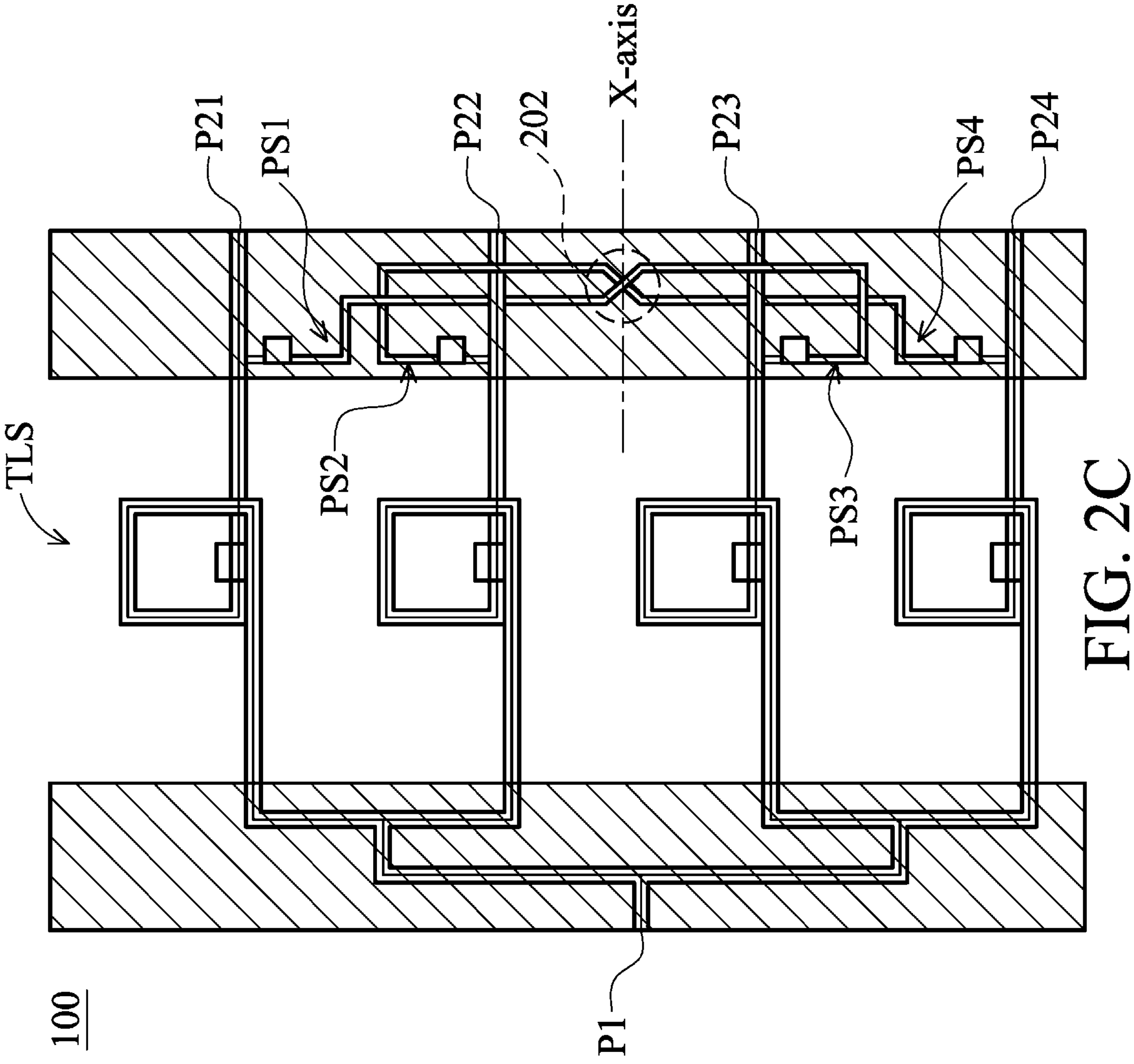
FIG. 2C shows an exemplary layout of the four-way coupler 100 of FIG. 1, having a phase shifting network implemented by the circuit design of FIG. 2B.

FIG. 2C shows an exemplary layout of the four-way coupler 100 of FIG. 1, having a phase shifting network implemented by the circuit design of FIG. 2B. As shown, the circuit layout of the phase shifters PS1 . . . PS4 is symmetric relative to an x-axis. The four second ports P21 . . . P24 of the four-way coupler 100 are widely spaced apart from each other by the layout of the phase shifters PS1 . . . PS4. In this manner, phased array channels are coupled from/to the four second terminals P21 . . . P24 of the disclosed four-way coupler without wasting routing lines, and the transmission line sections TLS provide an identical layout for different coupling paths.

Figure 3:
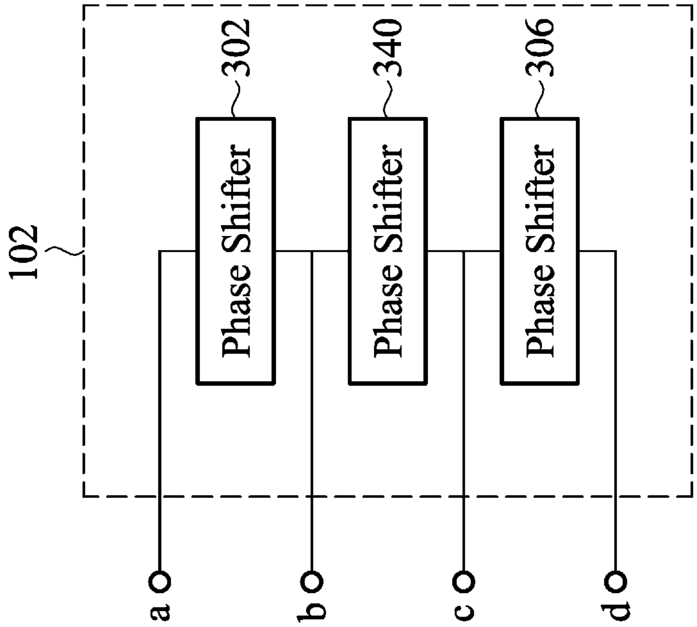
FIG. 3 shows an exemplary embodiment of the phase shifting network 102, which comprises three (M−1, where M=4) phase shifters 302, 304 and 306.

FIG. 3 shows an exemplary embodiment of the phase shifting network 102, which comprises three (M−1, where M=4) phase shifters 302, 304 and 306. The phase shifters 302, 304 and 306 are interleaved between the four I/O terminals a . . . d of the phase shifting network 102. In an exemplary embodiment, each of the three phase shifters 302, 304 and 306 provides a phase shift of 0 degree.

Figure 4B:
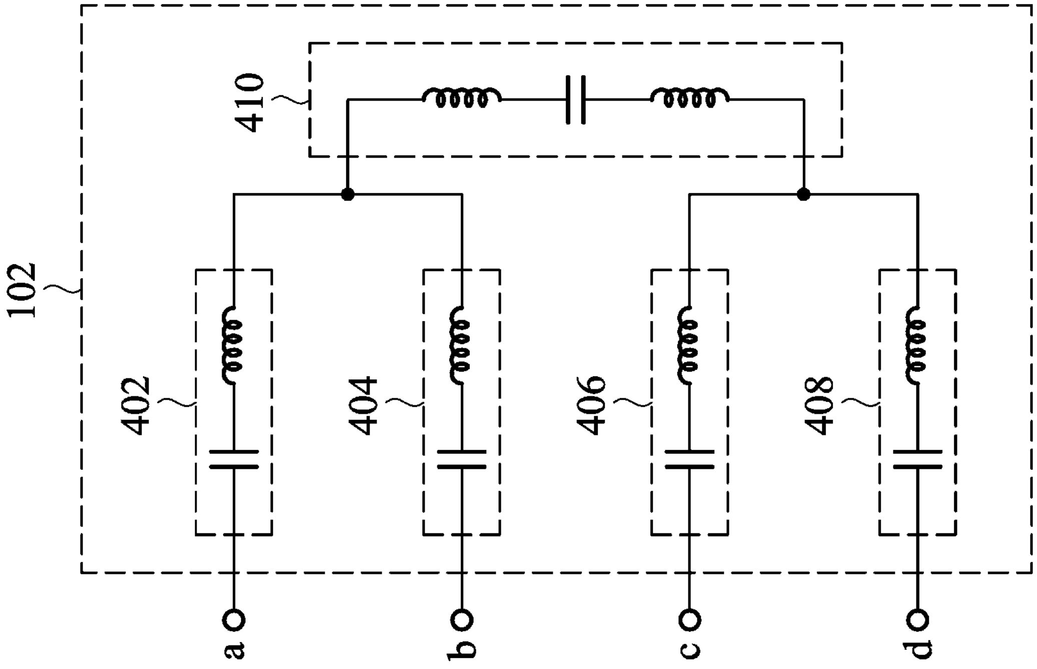
FIG. 4B shows an exemplary circuit design of the phase shifting network 102 of FIG. 4A.
Figure 4A:
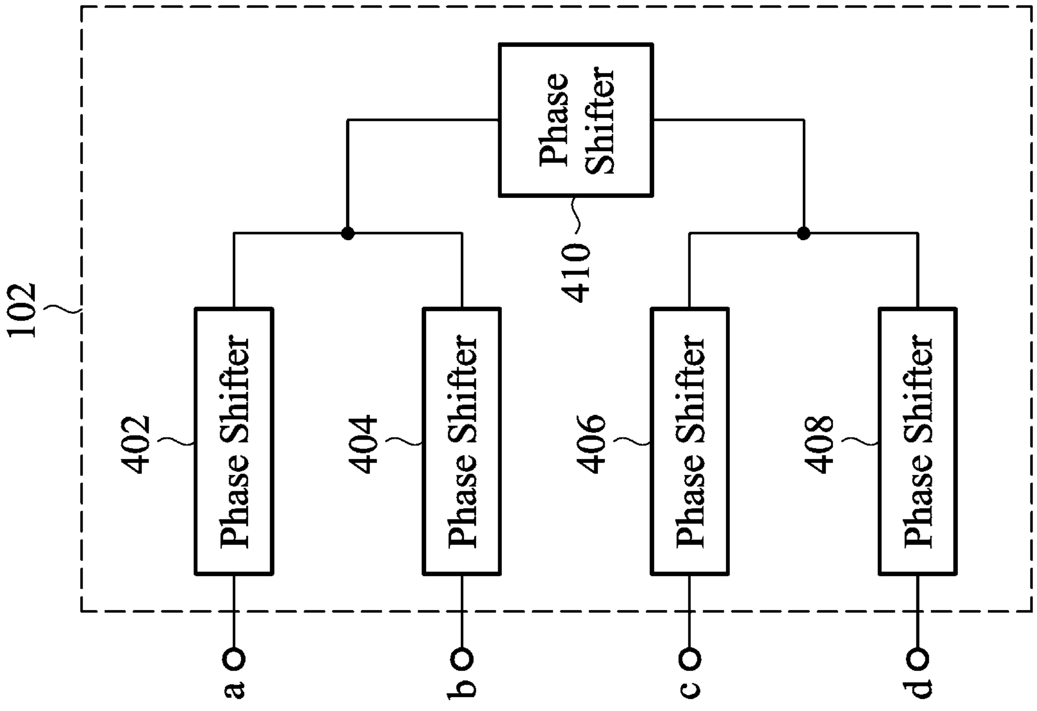
FIG. 4A shows an exemplary embodiment of the phase shifting network 102, which comprises five (greater than M where M is 4) phase shifters 402, 404, 406, 408 and 410.

FIG. 4A shows an exemplary embodiment of the phase shifting network 102, which comprises five (greater than M, where M is 4) phase shifters 402, 404, 406, 408 and 410. As shown, at least two I/O terminals of the four I/O terminals a . . . d are connected by more than two phase shifters. For example, the I/O terminals "a" and "c" are connected by three phase shifters 402, 410 and 406, the I/O terminals "a" and "d" are connected by three phase shifters 402, 410 and 408, the I/O terminals "b" and "c" are connected by three phase shifters 404, 410 and 406 and the I/O terminals "b" and "d" are connected by three phase shifters 404, 410 and 408. In an exemplary embodiment, each of the phase shifters 402, 404, 406, 408 and 410 provides a phase shift of 0 degree. In another exemplary embodiment, each of the phase shifters 402, 404, 406 and 408 provides a phase shift of 180 degrees while the phase shifter 410 provides a phase shift of 0 degree.

FIG. 4B shows an exemplary circuit design of the phase shifting network 102 of FIG. 4A. Each of the phase shifters 402, 404, 406 and 408 comprises a capacitor and an inductor connected in series. The phase shifter 410 comprises two inductors and one capacitor wherein the two inductors are symmetrically disposed relative to the capacitor.

Figure 4C:
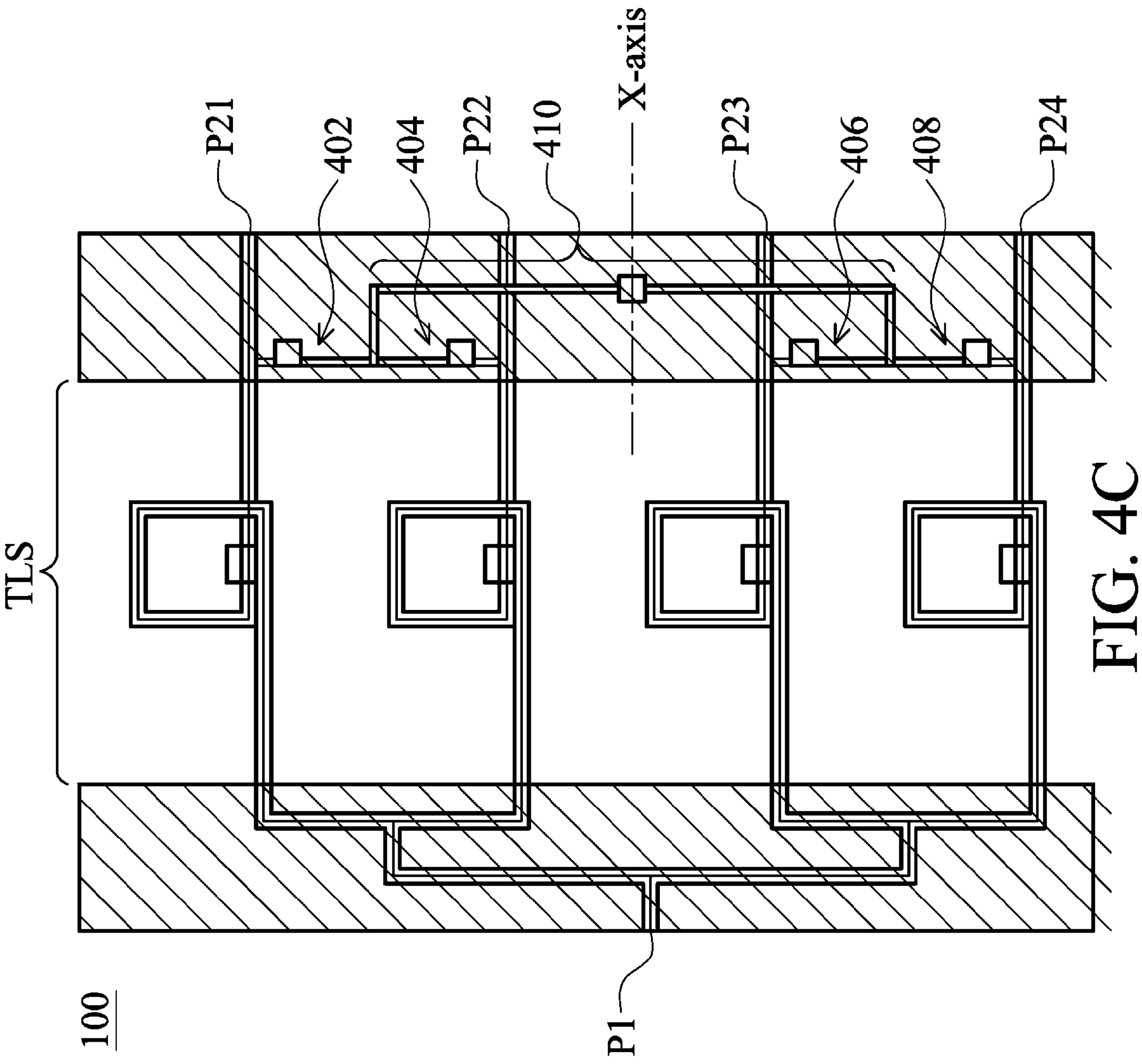
FIG. 4C shows an exemplary layout of the four-way coupler 100 of FIG. 1, having a phase shifting network implemented by the circuit design of FIG. 4B.

FIG. 4C shows an exemplary layout of the four-way coupler 100 of FIG. 1, having a phase shifting network implemented by the circuit design of FIG. 4B. As shown, the circuit layout of the phase shifters 402, 404, 406 and 408 is symmetric relative to the x-axis. The four second ports P21 . . . P24 of the four-way coupler 100 are widely spaced apart from each other by the layout of the phase shifters 402, 404, 406, 408 and 410. In this manner, phased array channels are coupled from/to the four second terminals P21 . . . P24 of the disclosed four-way coupler without wasting routing lines, and the transmission line sections TLS provide an identical layout for different coupling paths.

Figure 5:
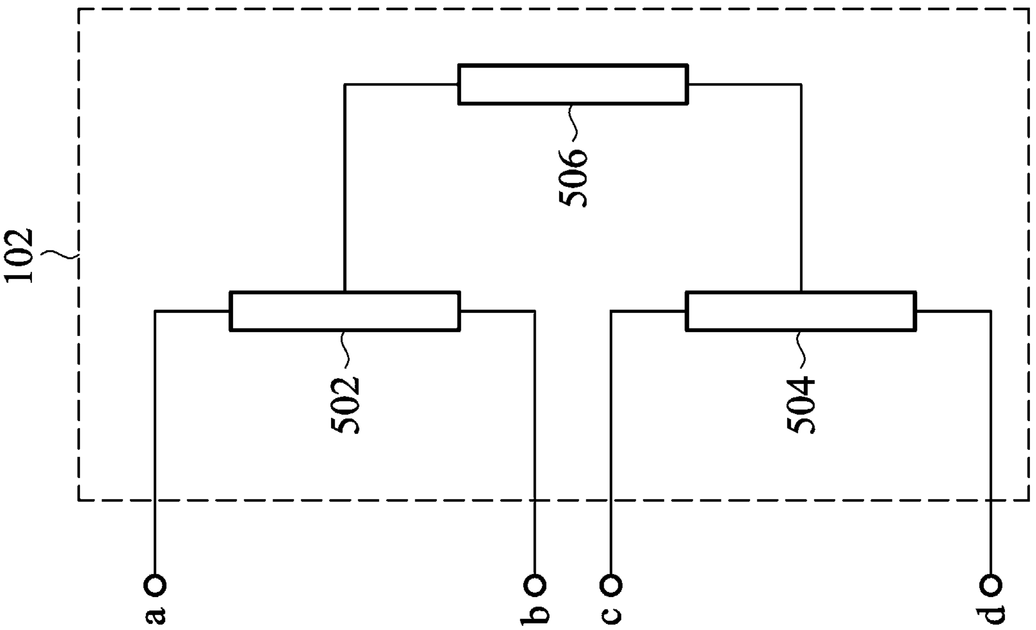
FIG. 5 shows an exemplary embodiment of the phase shifting network 102, which comprises a transmission line tree including two (M/2, where M=4) shorter transmission lines 502 and 504 and one (M/4, where M=4) longer transmission line 506.

FIG. 5 shows an exemplary embodiment of the phase shifting network 102, which comprises two (M/2, where M=4) shorter transmission lines 502 and 504 and one (M/4, where M=4) longer transmission line 506. The shorter transmission line 502 is coupled between the two I/O terminals “a” and “b.” The shorter transmission line 504 is coupled between the two I/O terminals “c” and “d.” The longer transmission line 506 is coupled between the two shorter transmission lines 502 and 504. In an exemplary embodiment, a first end of the longer transmission line 506 is connected at the center of the shorter transmission line 502, and a second end of the longer transmission line 506 is connected at the center of the shorter transmission line 504. The shorter transmission lines 502 and 504 and the longer transmission line 506 build a transmission line tree connecting the four I/O terminals a . . . d of the phase shifting network 102. When M is a power of 2 ($2^n$, where n is an integer), the n I/O terminals of the disclosed phase shifting network are connected by a transmission tree having M/2 transmission lines of a first length, $M/(2^2)$ transmission lines of a second length, . . . , and $M/(2^n)$ transmission lines of an $n^{th}$ length. These are, from the shortest to the longest length, the first, second . . . and $n^{th}$ lengths.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An M-way coupler, comprising:

a first port and M second ports, wherein M is an integer number greater than 1;

M transmission line sections, connecting to the first port and the M second ports, respectively;

M isolation resistors, wherein each of the M isolation resistors has a first terminal and a second terminal, and the first terminals of the M isolation resistors are connected to the M second ports, respectively;

a phase shifting network, having M I/O terminals connected to the second terminals of the M isolation resistors, respectively, wherein the phase shifting network is arranged to provide a phase shift within a predetermined tolerance margin between any two I/O terminals of the M I/O terminals of the phase shifting network.

2. The M-way coupler as claimed in claim 1, wherein a phase shift from one I/O terminal to another I/O terminal of the M I/O terminals of the phase shifting network is zero.

3. The M-way coupler as claimed in claim 1, wherein a circuit layout of the phase shifting network is symmetric.

4. The M-way coupler as claimed in claim 1, wherein impedances from one I/O terminal of the M I/O terminals to others of the M I/O terminals are all zero.

5. The M-way coupler as claimed in claim 1, wherein the M I/O terminals of the phase shifting network are physically spaced apart from one another.

6. The M-way coupler as claimed in claim 1, wherein the phase shifting network comprises a plurality of electronic components, and at least one of the electronic components is coupled between two I/O terminals of the M I/O terminals of the phase shifting network.

7. The M-way coupler as claimed in claim 1, wherein the phase shifting network comprises a plurality of phase shifters each coupled between two I/O terminals of the M I/O terminals of the phase-shifting network, and at least one of the phase shifters is an LC network or is a combination of a transmission line and a capacitor where the transmission line and the capacitor are connected in series.

8. The M-way coupler as claimed in claim 7, wherein the transmission line is operative to carry an alternating current of a radio frequency.

9. The M-way coupler as claimed in claim 7, wherein a total number of the phase shifters is M, each of the M phase shifters has a first terminal and a second terminal, and the second terminals of the M phase shifters are connected together while the first terminals of the M phase shifters are coupled to the M I/O terminals of the phase shifting network, respectively.

10. The M-way coupler as claimed in claim 7, wherein a total number of the phase shifters is M-1, and the M-1 phase shifters are interleaved between the M I/O terminals of the phase shifting network.

11. The M-way coupler as claimed in claim 7, wherein each of the phase shifters provides a phase shift of 0 degree or 180 degrees.

12. The M-way coupler as claimed in claim 7, wherein a total number of the phase shifters is greater than M, and at least two I/O terminals of the M I/O terminals of the phase shifting network are connected by more than two phase shifters.

13. The M-way coupler as claimed in claim 7, wherein the phase shifters have identical circuits.

14. The M-way coupler as claimed in claim 1, wherein the phase shifting network comprises M/2 shorter transmission lines and M/4 longer transmission lines, and, for every two I/O terminals of the M I/O terminals, one shorter transmission line of the M/2 shorter transmission lines is coupled therebetween, and, for every two shorter transmission lines of the M/2 shorter transmission lines, one longer transmission line of the M/4 longer transmission lines is coupled therebetween.

15. The M-way coupler as claimed in claim 14, wherein the shorter and longer transmission lines each is operative to a carry alternating current of a radio frequency.

16. The M-way coupler as claimed in claim 1, wherein the phase shifting network comprises a transmission line tree connecting to the M I/O terminals of the phase shifting network.

17. The M-way coupler as claimed in claim 16, wherein the transmission line tree comprises transmission lines, and each of the transmission lines is operative to carry an alternating current of a radio frequency.

18. The M-way coupler as claimed in claim 1, wherein the transmission line sections are implemented by identical circuits.

* * * * *